United States Patent
Koiwa et al.

(10) Patent No.: US 10,101,368 B2
(45) Date of Patent: Oct. 16, 2018

(54) CURRENT SENSOR

(71) Applicant: Asahi Kasei Microdevices Corporation, Tokyo (JP)

(72) Inventors: Yosuke Koiwa, Tokyo (JP); Toshinori Takatsuka, Tokyo (JP); Hideto Imajo, Tokyo (JP); Kenji Suzuki, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/321,327

(22) PCT Filed: Jun. 26, 2015

(86) PCT No.: PCT/JP2015/003230
§ 371 (c)(1),
(2) Date: Dec. 22, 2016

(87) PCT Pub. No.: WO2015/198609
PCT Pub. Date: Dec. 30, 2015

(65) Prior Publication Data
US 2017/0160313 A1 Jun. 8, 2017

(30) Foreign Application Priority Data

Jun. 27, 2014 (JP) .................................. 2014-132862

(51) Int. Cl.
*G01R 33/00* (2006.01)
*G01R 15/20* (2006.01)

(52) U.S. Cl.
CPC ........... *G01R 15/207* (2013.01); *G01R 15/20* (2013.01); *G01R 15/202* (2013.01); *G01R 15/205* (2013.01)

(58) Field of Classification Search
CPC .. G01R 15/207; G01R 15/205; G01R 15/202; G01R 15/20
(Continued)

(56) References Cited

U.S. PATENT DOCUMENTS 4,749,939 A * 6/1988 Seitz .................... G01R 15/207
324/117 H
6,462,531 B1 * 10/2002 Ohtsuka ................ H01L 43/065
257/E43.003
(Continued)

FOREIGN PATENT DOCUMENTS

EP 2733496 A1 5/2014
JP 2007-073803 A 3/2007
(Continued)

OTHER PUBLICATIONS

International Search Report issued in corresponding International Patent Application No. PCT/JP2015/003230 dated Sep. 15, 2015.
(Continued)

*Primary Examiner* — Reena Aurora
(74) *Attorney, Agent, or Firm* — Morgan, Lewis & Bockius LLP

(57) ABSTRACT

A current sensor includes: a conductor through which a current to be measured flows; magnetoelectric conversion elements disposed near the conductor; and an isolating member for supporting the magnetoelectric conversion elements, and the conductor is disposed so as not to contact with the isolating member and not to support the isolating member.

12 Claims, 6 Drawing Sheets

(58) Field of Classification Search
USPC .............................. 324/225, 207.2, 207.21
See application file for complete search history.

(56) References Cited

U.S. PATENT DOCUMENTS

2004/0080307 A1* 4/2004 Ohtsuka ............... H01L 43/065
  324/117 H
2014/0167736 A1 6/2014 Suzuki et al.

FOREIGN PATENT DOCUMENTS

| JP | WO2013/008462 A1 | 1/2013 |
| JP | 2013-245942 A | 12/2013 |
| TW | 201307865 | 7/2013 |
| WO | 2006/130393 A1 | 12/2006 |

OTHER PUBLICATIONS

Translation of the International Preliminary Report on Patentability issued in corresponding International Patent Application No. PCT/JP2015/003230 dated Jan. 5, 2017.
Supplementary European Search Report issued in corresponding European Patent Application No. 15811265.6 dated Jun. 23, 2017.

* cited by examiner

CURRENT SENSOR

TECHNICAL FIELD

The present invention relates to a current sensor having a magnetoelectric conversion element.

BACKGROUND ART

It is known that a current sensor has a magnetoelectric conversion element for instance and output a signal whose amplitude is proportional to a magnetic field generated by a current flowing through a conductor. For example, in Patent Literature 1, it is disclosed that a current sensor includes a substrate, a magnetic field converter, i.e., a magnetoelectric conversion element provided on the substrate and a current conductor, and the magnetoelectric conversion element detects a current flowing through the current conductor.

CITATION LIST

Patent Literature

PTL 1: International Patent Publication No. WO 2006/130393 Pamphlet

SUMMARY OF INVENTION

Technical Problem

With the current sensor of Patent Literature 1, however, although the substrate with the magnetoelectric conversion element is disposed on a lead frame via an insulator, there is a concern that the isolation resistance may decrease due to narrowing of the clearance between the substrate and the lead frame (FIG. 1 of Patent Literature 1).

In addition, with another current sensor of Patent Literature 1, one end of a conductive fastener with a current conducting part is fixed so as to define a clearance between the current conducting part provided at the other end of the conductive fastener and the magnetoelectric conversion element (FIG. 7 of Patent Literature 1). However, the height of the current conducting part has variation under the condition that only one end of the conductive fastener is fixed, and the clearance between the current conducting part and the magnetoelectric conversion element is likely to be affected by the variation. Accordingly, an isolation resistance may decrease.

In view of the aforementioned situation, it is an object of the present invention to provide a current sensor whereby it is possible to have excellent isolation resistance and reduce influence of a stray magnetic field, and improve magnetic field detection accuracy.

Solution to Problem

To solve the aforementioned problem, a current sensor includes:
a conductor through which a current to be measured flows;
a first magnetoelectric conversion element disposed near the conductor;
a second magnetoelectric conversion element disposed on the opposite side of the first magnetoelectric conversion element across the conductor; and
an isolating member for supporting the first and second magnetoelectric conversion elements; and
wherein the conductor is provided so as not to contact with the isolating member and not to support the isolating member.

In addition, the current sensor may further include:
a metal plate isolated from the conductor; and
a mold member which molds the conductor, the first magnetoelectric conversion element, the second magnetoelectric conversion element, the isolating member and the metal plate, and wherein:
the metal plate is in contact with the isolating member, and
a part of the metal plate may be exposed from the mold member.

The current sensor may include a signal processing IC disposed on the metal plate, and the first magnetoelectric conversion element and the second magnetoelectric conversion element may be electrically connected to the signal processing IC.

A part of the conductor may have a level difference, and the conductor may be disposed so as not to contact with the isolating member by the level difference.

The space between the conductor and the isolating member may be filled with mold resin.

The first magnetoelectric conversion element and the second magnetoelectric conversion element may be die-bonded to the isolating member using a die attach film.

The metal plate may include, in a plan view, a concave part formed in a recessed manner on the opposite side of the conductor, and a protruding part provided on the both ends of the concave part and protruding toward the conductor, and the conductor may include, in the plan view, a convex part formed along the concave part and the protruding part of the metal plate, respectively.

The conductor may be formed so as to surround the first magnetoelectric conversion element.

The second magnetoelectric conversion element may be disposed outside the conductor formed so as to surround the first magnetoelectric conversion element.

Each of a magnetosensitive part of the first magnetoelectric conversion element and a magnetosensitive part of the second magnetoelectric conversion element may be provided between an upper surface and a lower surface of the conductor in a perpendicular direction of a plane including the conductor.

when g indicates a distance between the conductor and the isolating member, $d1$ indicates a thickness of the first magnetoelectric conversion element, and $d2$ indicates a thickness of the second magnetoelectric conversion element, the following equations may be satisfied:

$$10 \text{ μm} \leq g \leq d1 \text{ μm} \quad (1)$$

$$10 \text{ μm} \leq g \leq d2 \text{ μm} \quad (2)$$

Each of a distance between the conductor and the first magnetoelectric conversion element and a distance between the conductor and the second magnetoelectric conversion element may be not less than 50 μm and not more than 150 μm, in a plan view.

The signal processing IC may include a bias circuit for applying a bias current to the first magnetoelectric conversion element and the second magnetoelectric conversion element, a subtraction circuit for calculating a difference between signals acquired from the first magnetoelectric conversion element and the second magnetoelectric conversion element, a correction circuit for correcting the calculated signal, and an amplification circuit for amplifying the corrected signal.

The signal processing IC may be configured to cancel the effect of an externally generated magnetic field and calculate a current value, on the basis of the difference between respective outputs of the first magnetoelectric conversion element and the second magnetoelectric conversion element.

The isolating member may be an isolating tape or an isolating sheet applied with adhesive.

The first magnetoelectric conversion element and the second magnetoelectric conversion element may be hall elements, magnetoresistive effect elements, hall ICs, or magnetoresistive effect ICs.

The signal processing IC may be configured to provide an upper limit value and a lower limit value of output signals in order to detect disconnection of the power source.

To detect disconnection of the power source, the signal processing IC may be configured so that the output signal thereof exceeds the upper limit value or falls below the lower limit value when the power source is disconnected.

The signal processing IC may be configured to output analog signals or digital signals.

The signal processing IC may be configured to provide an overcurrent detection circuit.

As a reference voltage of the signal processing IC, a voltage generated inside the signal processing IC or a voltage generated outside the signal processing IC may be commonly used to reduce the analog-to-digital conversion error due to the power source voltage variation, in a case where an A/D converter is used on the latter stage.

Advantageous Effects of Invention

According to the present invention, it is possible to have excellent isolation resistance, further reduce influence of a stray magnetic field, and improve magnetic field detection accuracy.

DESCRIPTION OF EMBODIMENTS

<First Embodiment>

Explanation will be hereinafter provided for one embodiment of a current sensor of the present invention, with reference to FIGS. 1 to 4. A current sensor 1 according to the embodiment is a sensor that has two magnetoelectric conversion elements such as hall elements. Further, the current sensor 1 is configured to cancel the effect of an externally generated magnetic field and detect current on the basis of the output of each magnetoelectric conversion element.

Figure 1:
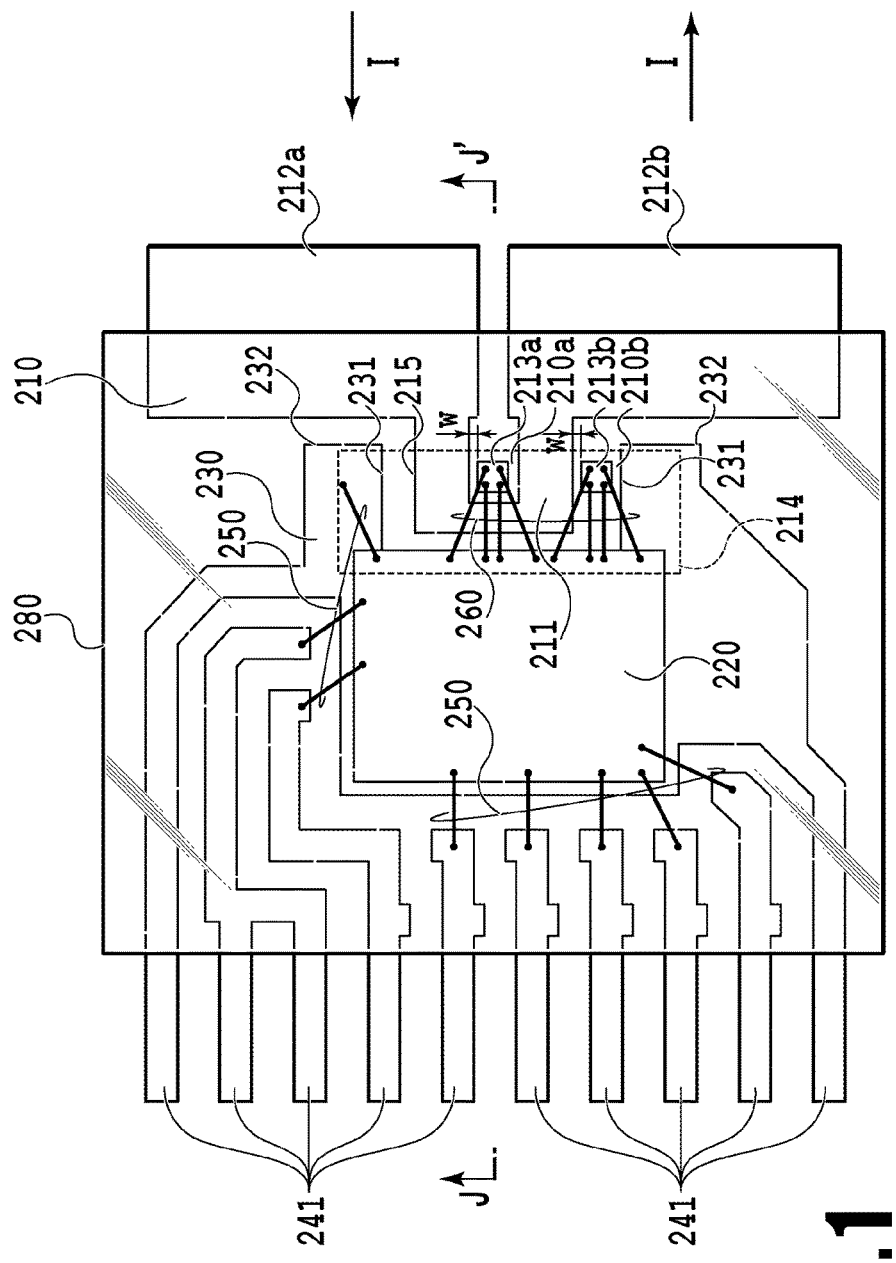
FIG. 1 is a top view showing an exemplary current sensor according to an embodiment of the present invention.

FIG. 1 is a top view showing an exemplary configuration of the current sensor 1 according to the first embodiment. As shown in FIG. 1, the current sensor 1 includes a conductor 210 with two lead terminals 212a and 212b, for instance, and through which a current to be measured I flows, a signal processing IC 220, a metal plate 230 for supporting the signal processing IC 220 and ten lead terminals 241, for instance.

It should be noted that the numbers of the lead terminals 212a, 212b and 241 are not limited to the example shown in FIG. 1 and can be changed.

In the embodiment, the conductor 210 has a current path 211 along which the current to be measured I flows in a circulating direction from the lead terminal 212a toward the lead terminal 212b. A gap 210a is formed between the lead terminals 212a and 212b so as to conform to the shape of the current path 211. In the present embodiment, for example, the current path 211 is U-shaped. However, aside from the shape shown in FIG. 1, channel-shaped, V-shaped, C-shaped or any other similar shape can be applied as the current path as long as the current path 211 is capable of detecting the current in the first magnetoelectric conversion element 213a and the second magnetoelectric conversion element 213b described below.

The first magnetoelectric conversion element 213a is disposed in the gap 210a of the conductor 210, and the second magnetoelectric conversion element 213b is disposed across the current path 211. The magnetoelectric conversion element 213b is disposed in a gap 210b between the conductor 210 and metal plate 230.

As shown in FIG. 1, in this current sensor 1, the metal plate 230 has, in a plan view, a concave part 231 with the central part of the metal plate 230 that is recessed toward the conductor 210. Both ends of the metal plate 230 have a protruding part 232 that protrudes toward the conductor 210. In an example of FIG. 1, the concave part 231 is formed such that the concave part 231 can be recessed by one step, for instance.

In the plan view, the conductor 210 has the concave part 231 of the metal plate 230 and a convex part 215 that is formed along the protruding part 232. In other words, the convex part 215 is formed such that the conductor 210 can protrude toward the metal plate 230 in the plan view.

In FIG. 1, an isolating member 214 is supported at least by the protruding part 232 on the back side of the metal plate 230, instead of the conductor 210 side. It should be noted that the isolating member 214 may be supported by the back side of the metal plate 230 (e.g., lateral parts of both ends of the concave part 231, or/and the bottom of the concave part 231) other than the protruding part 232.

Explanation has been provided above for the convex part 215 and the concave part 231 of transforming in one step. However, a stepwise configuration including two or more steps, for instance, may be set. Alternatively, the convex part 215 may be configured such that the conductor 210 (peripheral portion of the gap 210a) can protrude gradually or continuously. The concave part 231 may be configured to gradually or continuously form a recess so as to conform to the protruding shape of the conductor 210.

It is preferred that the conductor 210 has a thickness of 0.15 mm or less and a resistance value of 2 mΩ or less from the viewpoint of heat prevention.

The magnetoelectric conversion elements 213a and 213b include for instance hall elements, magnetoresistive effect elements, hall ICs, or magnetoresistive effect ICs.

In the current sensor 1 of the embodiment, the conductor 210, the lead terminal 241, the signal processing IC 220, the magnetoelectric conversion elements 213a and 213b are sealed with mold resin (mold member) 280 and formed as a same package as shown in FIG. 1. The mold resin 280 is mold resin such as epoxy resin or like.

When the current to be measured I flows through the conductor 210 in the current sensor 1, a magnetic field is generated according to the amount and direction of the current flowing through the U-shaped current path 211. Here, the magnetoelectric conversion element 213a is disposed in the gap 210a near the U-shaped current path 211, and detects the magnetic flux density generated by the current to be measured I flowing through the conductor 210 described above and outputs an electrical signal according to the magnetic flux density to the signal processing IC 220. In addition, the magnetoelectric conversion element 213b also detects the magnetic flux density generated by the current to be measured I flowing through the conductor 210 and outputs an electrical signal according to the magnetic flux density to the signal processing IC 220. In such a manner, the magnetoelectric conversion elements 213a and 213b perform current detection according to the current to be measured I flowing through the conductor 210.

The magnetoelectric conversion elements 213a and 213b are respectively disposed spaced apart from the conductor 210 by the gaps 210a and 210b so as not to contact with the conductor 210 always. Thus, the conductor 210 and the magnetoelectric conversion elements 213a and 213b are not electrically conducted, whereby a clearance is secured for maintaining isolation.

In the present embodiment, each of the distance w between the conductor 210 and the magnetoelectric conversion element 213a and the distance w between the conductor 210 and the magnetoelectric conversion element 213b is set to be not less than 50 µm and not more than 150 µm, for instance, in the plan view. When, for example, each of the distances w between the conductor 210 and the magnetoelectric conversion elements 213a and 213b is less than 50 µm, it is concerned about isolation voltage decrease, and, when each of the distances w is more than 150 µm, it is concerned that the magnetic field detected by the magnetoelectric conversion elements 213a and 213b when current flows through the conductor 210 may decrease, which may result in a lower detection accuracy.

In addition, the magnetoelectric conversion element 213a is supported by the isolating member 214 (indicated by a dashed line in FIG. 1). For example, as the isolating member 214, an isolating tape formed of a polyimide material with a high isolation voltage is used. It is noted that the isolating member 214 is not limited to a polyimide tape, and an isolating sheet with adhesive applied on a polyimide material or a ceramic material, for instance, may be applicable.

In FIG. 1, the metal plate 230 is in contact with the isolating member 214, and a part of the lead terminal 241 is exposed from the mold resin 280.

The magnetoelectric conversion elements 213a and 213b are electrically connected to the signal processing IC 220 via a wire (metal wire) 260, and the signal processing IC 220 is electrically connected to the lead terminal 241 via a wire (metal wire) 250.

Figure 3:
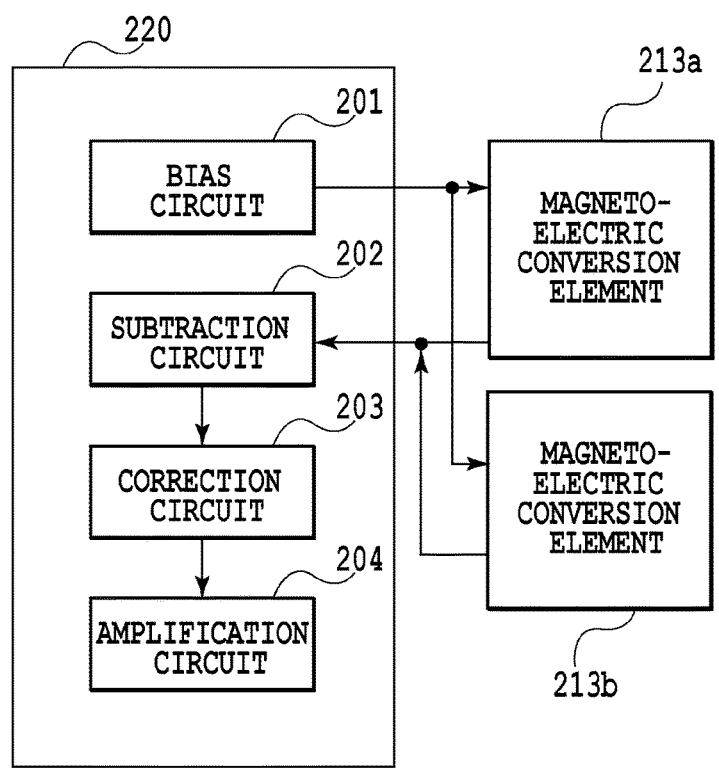
FIG. 3 is a functional block diagram of a signal processing IC.

For example, the signal processing IC 220 is configured by an LSI (Large Scale Integration), and includes in the embodiment a memory, a processor, a bias circuit, a subtraction circuit, a correction circuit, an amplification circuit and the like, for instance. The configuration of the signal processing IC 220 is shown in FIG. 3 as a detailed functional block diagram described below.

Figure 2:
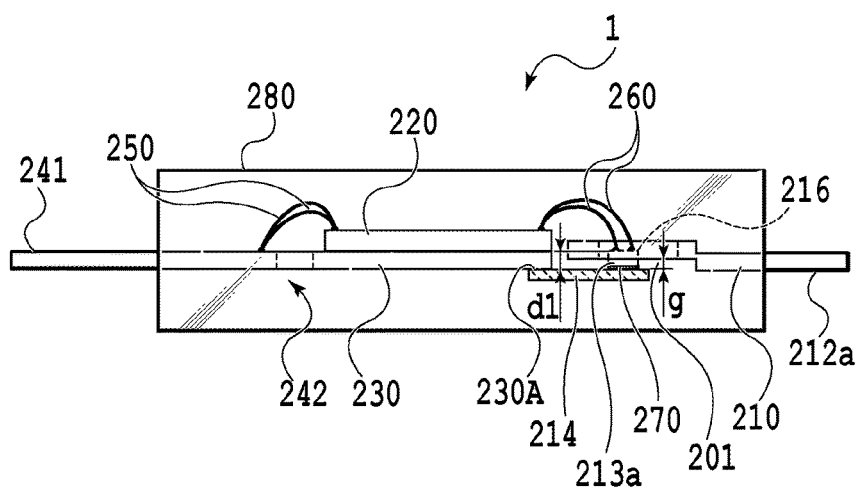
FIG. 2 is a side view of the current sensor of FIG. 1.

FIG. 2 is a side view taken along a line J-J' of the current sensor 1 shown in FIG. 1. As shown in FIG. 2, the isolating member 214 is joined to a part of the back side 230A of the metal plate 230 and formed so as to support the magnetoelectric conversion element 213a. In an example of FIG. 2, only the magnetoelectric conversion element 213a is shown, however, the magnetoelectric conversion element 213b is disposed in a manner similar to the magnetoelectric conversion element 213a.

A level difference 201 is formed on a part of the back side of the conductor 210 constituting the gap 210a, and the conductor 210 is disposed so as not to contact with the isolating member 214 always by the level difference 201. The level difference 201 shown in FIG. 2 is provided so that there will be no creepage surface to be formed when an insulator comes into contact with the conductive material, between the isolating member 214 and the conductor 210.

When providing a level difference in the conductor 210, the level difference may be provided in the conductor 210 facing the isolating member 214, and the isolating member 214 may be disposed in a space within the level difference. Accordingly, the conductor 210 does not come into contact with the isolating member 214 and, as a result, the conductor 210 does not support the isolating member 214. The level difference described above can be formed by coining, half blanking, or down setting, for instance.

In FIG. 2, the space between the back side of the conductor 210 and the isolating member 214 is filled with the mold resin 280. In the present embodiment, water absorption rate of the mold resin 280 is preferred to be not more than 0.5%, for instance. It enables expansion of the mold resin 280 to be suppressed and therefore it is possible to prevent stress from acting on the magnetoelectric conversion elements 213a and 213b.

If the current sensor 1 of the present embodiment is configured such that the isolating member 214 comes into contact with the conductor 210, it has a lower isolation performance than a configuration that prevents the isolating member 214 from contacting the conductor 210.

Therefore, in the current sensor 1 of the present embodiment, by forming the above level difference 201 in the conductor 210, the part of the level difference 201 of the conductor 210 is located above the isolating member 214, such that the conductor 210 does not come into contact with the isolating member 214. Thus, the isolating member 214 does not come into contact with the conductor 210, and creepage surface is not formed between the primary side (the conductor 210 side) and the secondary side of the current sensor 1. Therefore, because no creepage surface is formed within the current sensor, isolation performance in the current sensor 1 is maintained and it is possible to suppress occurrence of isolation due to a variation of the operation environment.

The isolating member 214 includes an isolating tape formed of a polyimide material with a high isolation, and is attached to the backside 230A of the metal plate 230 in a state shown in FIG. 2, for instance, and supports the magnetoelectric conversion element 213a from the back side thereof.

The conductor 210 and the magnetoelectric conversion element 213a are provided on the same surface of the isolating member 214. In addition, by setting the height position of the magnetosensitive surface 216 of the magnetoelectric conversion element 213 to a height between the bottom and the top of the conductor 210 (e.g., middle), it is possible to capture a larger amount of magnetic flux generated by the current to be measured I on the magnetosensitive surface 216 of the magnetoelectric conversion element 213a, whereby it is possible to improve a current detection sensitivity.

In an example of FIG. 2, when g indicates the distance between the conductor 210 and the isolating member 214, d1 indicates the thickness of the magnetoelectric conversion element 213a, and d2 (not shown) indicates the thickness of the magnetoelectric conversion element 213b, it is preferred to satisfy the following Equations 1 and 2 from a viewpoint of isolation voltage and detection accuracy.

$$10 \text{ μm} \leq g \leq d1 \text{ μm} \quad (1)$$

$$10 \text{ μm} \leq g \leq d2 \text{ μm} \quad (2)$$

For example, if g is less than 10 μm, there is a concern of isolation voltage decrease. If g is more than d1 μm, there is a concern that the magnetic field detected by the magnetoelectric conversion elements 213a and 213b may decrease when current flows through the conductor 210 whereby a detection accuracy may be lower.

FIG. 3 is a functional block diagram of an example of the signal processing IC 220. The signal processing IC 220 includes a bias circuit 201, a subtraction circuit 202, a correction circuit 203 and an amplification circuit 204. The bias circuit 201 is connected to the magnetoelectric conversion elements 213a and 213b so as to supply power to the magnetoelectric conversion elements 213a and 213b. In other words, the bias circuit 201 is a circuit for applying (causing inflow of) excitation current to the magnetoelectric conversion elements 213a and 213b.

The subtraction circuit 202 is configured to cancel (offset in-phase noise) the effect of an externally generated magnetic field and calculate the current value, on the basis of the difference between outputs of a pair of the magnetoelectric conversion elements 213a and 213b.

For example, when S1 and S2 respectively indicate the sensitivity of the magnetoelectric conversion elements 213a and 213b, B1 indicates a magnetic field generated from the conductor 210 and detected by the magnetoelectric conversion element 213a, B2 indicates a magnetic field detected by the magnetoelectric conversion element 213b, and BE indicates a stray magnetic field, the magnetic fields generated at the positions of the magnetoelectric conversion elements 213a and 213b are in opposite directions, but the stray magnetic field BE is supposed to act on the magnetoelectric conversion elements 213a and 213b in the same direction. Therefore, V1 and V2 are expressed by the following equations.

$$V1 = S1 \times (B1 + BE) \quad (3)$$

$$V2 = S2 \times (-B2 + BE) \quad (4)$$

Here, for a case of S1=S2 in the aforementioned Equation and Equation 4, the following is acquired by taking a difference in the signal processing IC 220, $$V1 - V2 = S1 \times (B1 + B2)$$

where the current value can be calculated by cancelling the effect of the stray magnetic field BE. B1 and B2 may not be the same. The foregoing configuration can realize an effect of about −50 dB as an effect of cancelling the stray magnetic field effect, allowing for a further improved sensitivity.

The subtraction circuit 202 shown in FIG. 3 is configured to calculate the difference between respective output signals from the magnetoelectric conversion elements 213a and 213b, for instance.

The correction circuit 203 is configured to correct the output value from the subtraction circuit 202 and correct the output values of the magnetoelectric conversion elements 213a and 213b according to a temperature correction coefficient preliminarily stored in the memory, on the basis of the operation temperature, for instance. Accordingly, a highly accurate current detection becomes possible with little temperature dependence.

The amplification circuit 204 is configured to amplify the output value from the correction circuit 203.

Next, with reference to FIGS. 1 and 2, explanation will be provided for the outline of a manufacture method of the current sensor 1 of the present embodiment.

Firstly, in addition to die-bonding the magnetoelectric conversion elements 213a and 213b on the isolating member 214 adhered to a lead frame, the signal processing IC 220 is die-bonded on the metal plate 230. Subsequently, the magnetoelectric conversion elements 213a and 213b and the signal processing IC 220 are wire-bonded with wires 250 and 260. Next, the conductor 210, the magnetoelectric conversion elements 213a and 213b, the signal processing IC 220 and the metal plate 230 are molded with the mold resin 280 and subjected to lead cutting. Next, the lead terminals 212a and 212b at the high voltage side and the lead terminal 241 at the low voltage side are formed by forming.

As explained above, according to the current sensor 1 of the present embodiment, the conductor 210 and the signal processing IC 220 have a gap for electrically isolating the electric sensor 1 both in the plan view and side view. Hence, an excellent isolation resistance can be had.

Here, flowing of current through the conductor 210 generates heat and, due to the difference of linear expansion coefficients between the mold resin 280 and the isolating member 214, stress acts on the magnetoelectric conversion element 213a and the magnetoelectric conversion element 213b. The magnetoelectric conversion element 213a and the magnetoelectric conversion element 213b are respectively disposed at different places, and therefore the magnetoelectric conversion element 213a and the magnetoelectric conversion element 213b respectively receive different stresses. Since the sensitivity of a magnetoelectric conversion element varies according to the stress, the magnetic field detection accuracy may decrease when different stresses act on the magnetoelectric conversion element 213a and the magnetoelectric conversion element 213b, respectively. In the current sensor 1 of the present embodiment, the metal plate 230 is in contact with the isolating member 214 and a part of the lead terminal 241 is exposed from the mold resin 280. Hence, even if the current to be measured I flows through the conductor 210 to generate heat, the heat is quickly released through the isolating member 214 and the lead terminal 241. Accordingly, it is possible to suppress decrease of the magnetic field detection accuracy.

From the aforementioned viewpoint, it is more preferable to utilize a silicon substrate with a high heat conductivity in place of the isolating member 214.

The metal plate 230 includes, in the plan view, a concave part 231 formed in a recessed manner on the opposite side of the conductor 210, and a protruding part 232 protruding toward the conductor 210. In addition, the conductor 210, seen from the upper surface, includes the convex part 215 formed along the concave part 231 of the metal plate 230 and the protruding part 232, respectively. In other words, the formation pattern of the convex part 215 of the conductor 210 and the concave part 231 and the protruding part 232 of the metal plate 230 makes it easier to release, toward the lead terminal 241, the heat generated when the current to be measured I flows through the conductor 210. Accordingly, it is possible to suppress decrease of the magnetic field detection accuracy and decrease of the stray magnetic field cancellation accuracy.

The conductor 210 is formed so as to surround the magnetoelectric conversion element 213a. Thus, a magnetic field starts acting on the magnetoelectric conversion element 213a, whereby an output signal of the magnetoelectric conversion element 213a is larger. As a result, it is possible to further improve the detection accuracy of the current sensor 1.

In addition, since the isolating member 214 is supported only by the metal plate 230 without coming in contact with the conductor 210, no creepage surface is formed between the conductor 210 and the isolating member 214, and therefore the isolation of the current sensor 1 becomes unlikely to decrease.

The die attach film 270 shown in FIG. 2 is attached to the back side of a wafer before dicing of the wafer, and therefore the creepage surface does not extend so as to form a skirt part toward the conductor 210 around the magnetoelectric conversion elements 213a and 213b, unlike the case of fixing the magnetoelectric conversion elements 213a and 213b using isolation paste or conductive paste described below, whereby the isolation of the current sensor further improves.

In general, the magnetoelectric conversion elements 213a and 213b are firmly fixed onto the isolating member 214 using a die-bonding material. When the conductive paste is used as the die-bonding material, the skirt part of the paste shortens the isolation distance between the magnetoelectric conversion elements 213a and 213b and the conductor 210. In addition, a creepage surface may be formed by the skirt part of the paste also in a case where the isolation paste is used as the die-bonding material.

Figure 4:
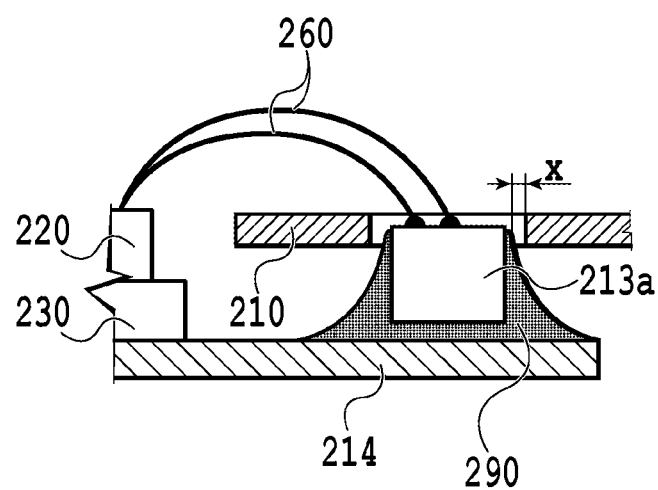
FIG. 4 is an explanatory diagram showing an exemplary fixed state when a magnetoelectric conversion element is firmly fixed onto an isolating member by use of a general resin paste.

In FIG. 4, in a case where the magnetoelectric conversion elements 213a and 213b are firmly fixed onto the isolating member 214 using the isolation paste 290, the isolation distance to the conductor 210 is shortened by the skirt part of the isolation paste 290. In this case, the isolation of the current sensor may decrease when the distance x between the skirt part of isolation paste 290 and the primary conductor 210 is not more than 10 µm.

<Second Embodiment>

Figure 5:
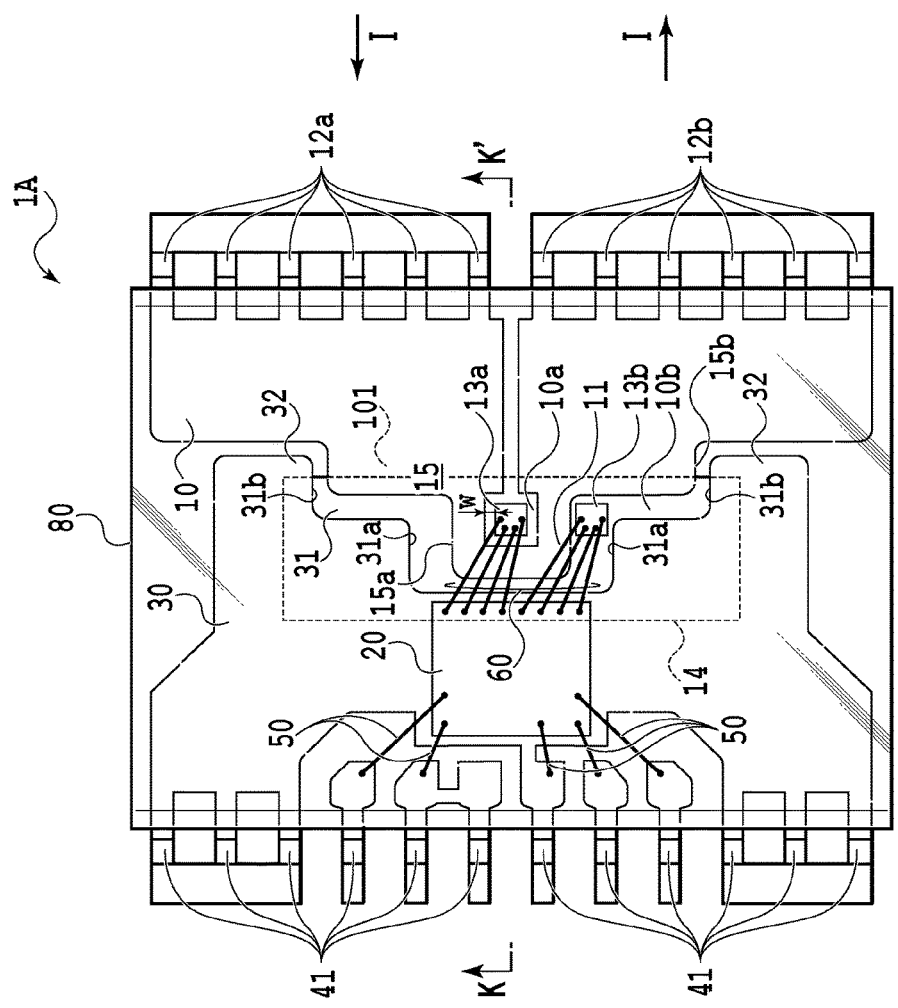
FIG. 5 is a top view showing an exemplary current sensor according to a second embodiment of the present invention.
Figure 6:
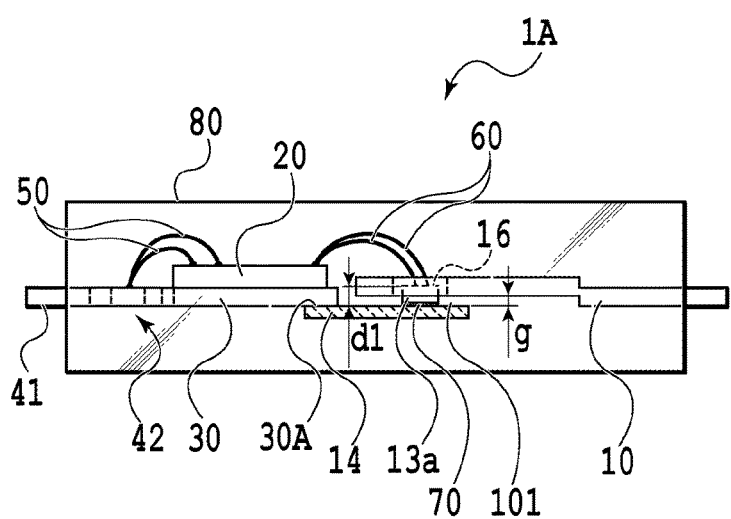
FIG. 6 is a side view of the current sensor of FIG. 5.

Next, with reference to FIGS. 5 and 6, explanation will be provided for a second embodiment.

In a current sensor 1A shown in FIG. 5, in the concave part 31 of the metal plate 30 and the convex part 15 of the conductor 10, the concave parts 31a and 31b recessing in two steps and the convex parts 15a and 15b protruding in two steps are formed. By doing so, the current sensor 1A is characteristic in that the strength of the isolation part is further enhanced by increase of the attachment area of the isolating member 14.

FIG. 5 is a top view showing an exemplary configuration of the current sensor 1A according to the second embodiment. FIG. 6 is a side view taken along a line K-K' in FIG. 5. The current sensor 1A is characteristic in that the convex part 15 (15a and 15b) of the conductor 10 is also extended with a multi-step shape (two-step shape) so as to conform to the shape of the concave part 31 (31a and 31b) of the metal plate 30, whereby the resistance value of the entire conductor is reduced. A configuration of other components is the same as the first embodiment.

The invention claimed is:

1. A current sensor comprising:
    a conductor through which a current to be measured flows;
    a first magnetoelectric conversion element disposed near the conductor;
    a second magnetoelectric conversion element disposed on the opposite side of the first magnetoelectric conversion element across the conductor;
    an isolating member for supporting the first and second magnetoelectric conversion elements; and
    a metal plate isolated from the conductor, and wherein:
    the isolating member is not supported by the conductor, but is supported by the metal plate, and
    a part of the conductor has a level difference, and the conductor is disposed so as not to contact with the isolating member by the level difference.

2. The current sensor according to claim 1, further comprising a mold member for molding the conductor, the first magnetoelectric conversion element, the second magnetoelectric conversion element, the isolating member and the metal plate, and wherein:
    the metal plate is in contact with the isolating member, and
    a part of the metal plate is exposed from the mold member.

3. The current sensor according to claim 2, further comprising a signal processing IC disposed on the metal plate, and
    wherein the first magnetoelectric conversion element and the second magnetoelectric conversion element are electrically connected to the signal processing IC.

4. The current sensor according to claim 3, wherein the signal processing IC is configured to cancel an effect of an externally generated magnetic field to calculate a current value on the basis of a difference between respective outputs of the first magnetoelectric conversion element and the second magnetoelectric conversion element.

5. The current sensor according to claim 1, wherein a space between the conductor and the isolating member is filled with mold resin.

6. The current sensor according to claim 1, wherein the first magnetoelectric conversion element and the second magnetoelectric conversion element are die-bonded to the isolating member using a die attach film.

7. The current sensor according to claim 1, wherein in a plan view the metal plate includes a concave part formed in a recessed manner on the opposite side of the conductor, and a protruding part provided on the both ends of the concave part and protruding toward the conductor, and
    in the plan view the conductor includes a convex part formed along the concave part and the protruding part of the metal plate, respectively.

8. The current sensor according to claim 7, wherein the conductor is formed so as to surround the first magnetoelectric conversion element, and
    the second magnetoelectric conversion element is disposed outside the conductor formed so as to surround the first magnetoelectric conversion element.

9. The current sensor according to claim 1, wherein each of a magnetosensitive part of the first magnetoelectric conversion element and a magnetosensitive part of the second magnetoelectric conversion element is provided between an upper surface and a lower surface of the conductor in a perpendicular direction of a plane with the conductor.

10. The current sensor according to claim 1, wherein the following equations are satisfied:

$$10 \ \mu m > g > d1 \ \mu m \tag{1}$$

$$10 \ \mu m > g > d2 \ \mu m \tag{2}$$

where g is a distance between the conductor and the isolating member, d1 is a thickness of the first magnetoelectric conversion element, and d2 is a thickness of the second magnetoelectric conversion element.

11. The current sensor according to claim 1, wherein each of a distance w between the conductor and the first magnetoelectric conversion element and a distance w between the conductor and the second magnetoelectric conversion element is not less than 50 μm and not more than 150 μm, in a plan view.

12. The current sensor according to claim 1, wherein the isolating member is an isolating tape or an isolating sheet applied with adhesive.

* * * * *